United States Patent
Jordan, Jr. et al.

(10) Patent No.: US 9,832,902 B2
(45) Date of Patent: Nov. 28, 2017

(54) FORMULATED RESIN COMPOSITIONS FOR FLOOD COATING ELECTRONIC CIRCUIT ASSEMBLIES

(71) Applicant: ELANTAS PDG, INC., St. Louis, MO (US)

(72) Inventors: Richard David Jordan, Jr., Allegany, NY (US); Thomas C. Scanlon, IV, Hinsdale, NY (US)

(73) Assignee: ELANTAS PDG, INC., St. Louis, MO (US)

( * ) Notice: Subject to any disclaimer, the term of this patent is extended or adjusted under 35 U.S.C. 154(b) by 103 days.

(21) Appl. No.: 14/556,116

(22) Filed: Nov. 29, 2014

(65) Prior Publication Data

US 2015/0077947 A1    Mar. 19, 2015

Related U.S. Application Data

(63) Continuation-in-part of application No. 14/292,876, filed on May 31, 2014.

(60) Provisional application No. 61/829,681, filed on May 31, 2013.

(51) Int. Cl.

| | |
|---|---|
| *C08G 18/24* | (2006.01) |
| *C08G 18/48* | (2006.01) |
| *C08G 18/76* | (2006.01) |
| *C08G 18/80* | (2006.01) |
| *C08G 59/00* | (2006.01) |
| *C08G 59/18* | (2006.01) |
| *C08G 77/04* | (2006.01) |
| *C08L 33/08* | (2006.01) |
| *C08L 33/10* | (2006.01) |
| *C09D 133/08* | (2006.01) |
| *C09D 133/10* | (2006.01) |
| *C09D 175/04* | (2006.01) |
| *C09D 183/04* | (2006.01) |
| *H05K 3/28* | (2006.01) |
| *H05K 7/14* | (2006.01) |

(52) U.S. Cl.
CPC ......... *H05K 7/1427* (2013.01); *C08G 18/246* (2013.01); *C08G 18/4825* (2013.01); *C08G 18/7664* (2013.01); *C08G 18/8067* (2013.01); *C08G 59/00* (2013.01); *C08G 59/184* (2013.01); *C08G 77/04* (2013.01); *C08L 33/08* (2013.01); *C08L 33/10* (2013.01); *C09D 133/08* (2013.01); *C09D 133/10* (2013.01); *C09D 175/04* (2013.01); *C09D 183/04* (2013.01); *H05K 3/284* (2013.01); *H05K 3/285* (2013.01); *H05K 2201/09872* (2013.01)

(58) Field of Classification Search
CPC ...... H05K 7/1427; H05K 3/285; H05K 3/284; H05K 2201/09872; C08G 18/4825; C08G 18/7664; C08G 18/246; C08G 18/8067; C08G 59/00; C08G 59/184; C08G 77/04; C09D 175/04; C09D 133/08; C09D 133/10; C09D 183/04; C08L 33/08; C08L 33/10
See application file for complete search history.

(56) References Cited

U.S. PATENT DOCUMENTS

| | | | |
|---|---|---|---|
| 3,733,426 A | 5/1973 | Kaufman et al. | |
| 3,747,037 A * | 7/1973 | Earing | C08G 18/10 264/272.19 |
| 3,962,094 A | 6/1976 | Davis et al. | |
| 4,008,197 A | 2/1977 | Brauer et al. | |
| 4,168,258 A | 9/1979 | Brauer et al. | |
| 4,170,559 A | 10/1979 | Kroplinski et al. | |
| 4,224,164 A | 9/1980 | Brauer et al. | |
| 4,256,617 A | 3/1981 | Kroplinski et al. | |
| 4,267,044 A | 5/1981 | Kroplinski et al. | |
| 4,284,506 A | 8/1981 | Tetenbaum et al. | |
| 4,300,184 A | 11/1981 | Colla | |
| 4,373,081 A | 2/1983 | Nachtkamp et al. | |
| 4,375,521 A | 3/1983 | Arnold | |
| 4,395,530 A | 7/1983 | Hammond | |

(Continued)

FOREIGN PATENT DOCUMENTS

| | | |
|---|---|---|
| CN | 102850989 A | 1/2013 |
| CN | 102911636 A | 2/2013 |

(Continued)

OTHER PUBLICATIONS

Devcon Technical Data Sheet for 5 Minute Epoxy Gel, Author unknown, Oct. 6, 2010.*

(Continued)

*Primary Examiner* — Patrick Niland
(74) *Attorney, Agent, or Firm* — Curatolo Sidoti Co., LPA; Joseph G. Curatolo; Salvatore A. Sidoti (57) ABSTRACT

Electrical circuit assemblies flood coated with polymeric flood coat compositions as described or exemplified herein are provided. The flood coat composition is characterized as having a sufficient gel time and thixotropic index as to substantially cover or encapsulate the electrical circuit assembly as a fixed mass upon cure such that the thickness of the polymeric coating on surfaces horizontal to the assembly is from 20 mils to 75 mils, and the thickness on surfaces vertical to the assembly is from 4 mils to 20 mils. Such flood coated assemblies and devices containing same are advantageous over conventional potting materials or conformal coatings because they require less material thereby reducing weight and cost, and they are able to withstand extreme environmental stresses such as from temperature and/or vibrations.

24 Claims, 3 Drawing Sheets

(56) References Cited

U.S. PATENT DOCUMENTS

| | | |
|---|---|---|
| 4,444,976 A | 4/1984 | Rabito |
| 4,454,176 A | 6/1984 | Buckfelder et al. |
| 4,518,631 A | 5/1985 | Antonen |
| 4,603,188 A | 7/1986 | Kusakawa et al. |
| 4,842,736 A | 6/1989 | Bray et al. |
| 4,865,735 A | 9/1989 | Chu et al. |
| 4,876,303 A | 10/1989 | Chapin et al. |
| 4,879,032 A | 11/1989 | Zemlin |
| 4,886,600 A | 12/1989 | Chu et al. |
| 4,923,756 A | 5/1990 | Chung et al. |
| 5,266,145 A | 11/1993 | Duck et al. |
| 5,288,797 A | 2/1994 | Khalil et al. |
| 5,306,798 A * | 4/1994 | Horn .................... C08G 18/50 528/58 |
| 5,360,543 A | 11/1994 | Usifer et al. |
| 5,556,934 A | 9/1996 | Hagquist et al. |
| 5,863,597 A | 1/1999 | Lynch |
| 5,871,822 A | 2/1999 | Lepsche et al. |
| 6,130,268 A | 10/2000 | Murray |
| 6,653,371 B1 * | 11/2003 | Burns .................... C08G 59/18 523/455 |
| 7,303,675 B2 | 12/2007 | De La Cruz |
| 7,781,513 B2 | 8/2010 | Lucas et al. |
| 8,360,390 B2 | 1/2013 | Fornage |
| 8,822,844 B1 | 9/2014 | Dimke et al. |
| 2003/0008977 A1 * | 1/2003 | Zook .................... C08G 75/045 525/212 |
| 2004/0012936 A1 | 1/2004 | Gravelin |
| 2004/0072953 A1 | 4/2004 | Hung et al. |
| 2004/0138402 A1 | 7/2004 | Thiele et al. |
| 2004/0198943 A1 | 10/2004 | Slack et al. |
| 2005/0073552 A1 | 4/2005 | Smoot et al. |
| 2006/0076047 A1 | 4/2006 | Green et al. |
| 2008/0149257 A1 | 6/2008 | Tribelhorn et al. |
| 2009/0124751 A1 | 5/2009 | Lucas et al. |
| 2009/0242123 A1 | 10/2009 | Zhang et al. |
| 2009/0294015 A1 * | 12/2009 | Gluck .................... B29C 70/78 156/71 |
| 2013/0059082 A1 | 3/2013 | Wang et al. |
| 2014/0355225 A1 | 12/2014 | Jordan, Jr. et al. |

FOREIGN PATENT DOCUMENTS

| | | |
|---|---|---|
| EP | 0037403 A1 | 10/1981 |
| JP | H03217413 A | 9/1991 |
| JP | H0657236 A | 3/1994 |
| JP | 2006096912 A | 4/2006 |
| WO | 2004035647 A1 | 4/2004 |
| WO | 2009020774 A1 | 2/2009 |
| WO | 2009039145 A1 | 3/2009 |
| WO | 2009123905 A1 | 10/2009 |
| WO | 2012010559 A1 | 1/2012 |

OTHER PUBLICATIONS

Devcon Technical Data Sheet for 5 Minute Epoxy Gel, Author unknown, Oct. 6, 2010 (supplied with office action mailed Jul. 28, 2016).*

English translation of JP 03-217473, Toru et al., Sep. 1991.*

Odian, George, Principles of Polymerization, Third Edition, 1991, pp. 29-33.*

International Search Report and Written Opinion for International Application No. PCT/US2015/019882, International Filing Date Mar. 11, 2015, Date of Mailing Jul. 3, 2015, 11 pages.

International Search Report for International Application No. PCT/US2014/040421, International Filing Date May 31, 2014, Date of Mailing Aug. 25, 2014, 3 pages.

International Search Report for International Application No. PCT/US2014/067837; International Filing Date Nov. 29, 2014; Date of Mailing Feb. 23, 2015; 4 pages.

International Search Report for International Application No. PCT/US2015/062342, International Filing Date Nov. 24, 2015, Date of Mailing Apr. 7, 2016, 5 pages.

International Search Report for International Application No. PCT/US2016/026347, International Filing Date Apr. 7, 2016, Date of Mailing Jun. 1, 2016, 6 pages.

Written Opinion for International Application No. PCT/US2014/040421, International Filing Date May 31, 2014, Date of Mailing Aug. 25, 2014, 6 pages.

Written Opinion for International Application No. PCT/US2015/062342, International Filing Date Nov. 24, 2015, Date of Mailing Apr. 7, 2016, 5 pages.

Written Opinion for International Application No. PCT/US2016/026347, International Filing Date Apr. 7, 2016, Date of Mailing Jun. 1, 2016, 5 pages.

Written Opinion of the International Search Report for International Application No. PCT/US2014/067837; International Filing Date Nov. 29, 2014; Date of Mailing Feb. 23, 2015; 6 pages.

Wypych; "Plasticizers Use and Selection for Specific Polymers"; ChemTec Laboratories, Inc., Toronto, Canada; Handbook of Plasticizers; Chapter 11; 107 pages; No Date.

* cited by examiner

FORMULATED RESIN COMPOSITIONS FOR FLOOD COATING ELECTRONIC CIRCUIT ASSEMBLIES

CROSS-REFERENCE TO RELATED APPLICATIONS

This application is a continuation-in-part of U.S. application Ser. No. 14/292,876, filed May 31, 2014, which claims benefit of priority to U.S. Provisional Application No. 61/829,681 filed May 31, 2013, each of which is incorporated herein by reference in its entirety.

BACKGROUND OF THE INVENTION

1. Field of the Invention

The present invention generally relates to formulated resin systems, electronic circuit assemblies coated with such systems, and to methods for applying same.

More specifically, the present invention relates to protective polymeric films for flood coating electronic circuit assemblies and other electronic devices that can be part of a unitized construction, and which are susceptible to extreme environmental and/or mechanical degradation such as from vibration, thereby encapsulating the devise or assembly upon cure and protecting it from damage due to the extreme environmental exposure.

2. Description of the Related Art

There are a large assortment of two component filled or unfilled polymeric resin systems for potting and/or encapsulating of electrical circuit assemblies or other such electronic devices. Many of these formulations are based on similar technology using many of the same base raw materials to achieve desired properties during processing and/or at cure. The formulations are usually made up such materials as acrylic, polyurethane, silicone, or epoxy synthetic resins.

The main objective of a potting material is to provide protection and support of sensitive electronics in environments including exposure to chemical, high humidity, vibration, and temperature extremes. While these potting materials are successful, there is a need to reduce the weight and cost of such electronic assemblies. Potting materials are traditionally used to fill the device or assembly and, thus, are very thick. This feature can be considered disadvantageous for certain applications. Potted objects are also not easily re-enterable (i.e., soft enough to cut into for ease of removal for inspection and/or repair of the filled component). Accordingly, low hardness (soft), low modulus (elastic), vibration dampening polyurethane and silicone potting and encapsulation systems have been identified as the most desired materials for providing environmental protection and mechanical support of surface mount electronics that are subjected to such temperature extremes, as well as vibration, for prolonged periods of time.

To this end, various manufacturers of electronic assemblies have chosen to use dielectric conformal coatings as their environmental protection barrier. Such conformal coatings are typically 2 mils (±1 mils) in thickness. Although this approach has proven successful in certain applications where a static environment exists, applications requiring mechanical support and environmental protection of large components exposed to temperature extremes and vibration have proven unsuccessful due to fatigue failure over time. The use of lead-free solder in electronic components has also contributed to the need for greater mechanical support and vibration dampening of large heavy electrical components.

The following U.S. patents or Published Applications address some of the design challenges discussed above: U.S. Pat. Nos. 4,300,184; 5,863,597; 5,871,822; 8,360,390; and US2006/0076047.

Therefore, in an effort to fill the gap between thick and costly potting compounds and thin dielectric conformal coatings with little mechanical integrity, low hardness, low modulus formulated resin systems that are capable of providing mechanical structural support while providing vibrational dampening and reducing the overall resin weight and cost used in a conventionally potted assembly would be a useful advance in the art and could find rapid acceptance in any industry where use of potting and/or conformal coating systems are required.

SUMMARY OF THE INVENTION

The foregoing and additional objects are attained in accordance with the principles of the invention described herein, which provides, in one aspect a flood coat composition having a multi-part (e.g., two or more parts) polymeric resin system characterized in that the flood coat composition has a gel time from 5 to 12 minutes and a thixotropic index from 1 to 5, such that when cured, the flood coat composition has a Shore hardness from 15 A to 85 D.

In another aspect, the invention provides electrical circuit assemblies including a base support with a plurality of electrical circuit components extending outwardly from the surface of the base support attached thereto and electrically connected to the electrical circuitry, wherein the electrical circuit assembly is flood coated with a predetermined volume of a flood coat composition as defined and described in detail herein, such that the flood coat composition substantially covers and/or encapsulates the electrical circuit assembly as a fixed mass upon cure and has a thickness on component surfaces parallel (i.e., horizontal) to the base support from 20 mils to 75 mils, and a thickness on component surfaces perpendicular (i.e., vertical) to the base support from 4 mils to 20 mils.

In still another aspect, the invention provides methods of providing mechanical support and environmental protection to an electrical circuit assembly exposed to prolonged temperature extremes and vibration by applying a predetermined volume of a flood coat composition as defined and described in detail herein to substantially cover or encapsulate the electrical circuit assembly, allowing the flood coat composition to gel; and curing the flood coat composition for a time and at a temperature sufficient to provide a Shore hardness of 15 A to 85 D.

These and other objects, features and advantages of this invention will become apparent from the following detailed description of the various aspects of the invention taken in conjunction with the accompanying Figures and Examples.

BRIEF DESCRIPTION OF THE DRAWINGS

So that the manner in which the above-recited features of the present invention can be understood in better detail, a more particular description of the invention may be had by reference to embodiments, some of which are illustrated or captured in the appended figures. It is to be noted, however, that the appended figures represent only typical embodiments of this invention and should not be considered limiting of its scope, for the invention may admit to other equally effective embodiments.

To facilitate understanding, identical reference numerals have been used, where possible, to designate identical elements that are common to the figures. The figures are not drawn or depicted to scale and may be simplified for clarity. Furthermore, it is contemplated that elements and features of one embodiment may be beneficially incorporated in other embodiments without further recitation.

DETAILED DESCRIPTION OF CERTAIN EMBODIMENTS OF THE INVENTION

As summarized above, the present invention pertains to the discovery of formulated resin systems possessing certain performance characteristics that are useful for protectively coating and/or encapsulating an electronic device such as a surface mount electronic device that is subject to harsh environments including exposure to chemical, high humidity, vibration, and temperature extremes for prolonged periods of time. As discussed more fully below, the inventors have surprisingly discovered polymeric formulations that are based on dead elastomer/energy absorbing chemistry back bones that provide low to moderate hardness and low modulus, and that reduce the overall resin weight and cost compared to conventionally potted devices, while simultaneously providing the same environmental protection, mechanical support, and vibrational dampening. Such advantages were heretofore thought unattainable without using a traditional potting material that completely fills the space where the electronic devise is housed. Accordingly, in view of the polymeric formulated resins described herein, the use of such products and flood coat processes can be used to replace potting materials where weight and overall cost due to the volume of resin is a concern, while still achieving desired performance properties.

Accordingly, in one aspect, the invention provides flood coat compositions of a multi-part polymeric resin system which is characterized by having a gel time from 5 to 12 minutes and a thixotropic index from 1 to 5 such that when cured the flood coat composition has a Shore hardness from 15 A to 85 D.

As used herein, the term "cured" refers to the hardening of the flood coat composition via reaction between the resin and the catalyst such as in a multi-part polymeric resin system, or via evaporation of the solvent carrier of a polymeric system (such as in a polymeric system that does not require a catalyst). A cured flood coat composition will exhibit its full strength and improve its usability.

While the preferred multi-part polymeric resin system contemplated for use herein includes polyurethane, those of skill in the art will appreciate that any suitable polymeric resin may be used including, for example, acrylic, silicone, polysiloxane, and epoxy, or any hybrids of these resins (e.g., epoxy/polyurethane, or acrylic/polyurethane). In certain embodiments, the multi-part polymeric resin system includes a polyurethane, which can be formed from a polyisocyanate prepolymer synthesized from a medium functionality polymeric diphenylmethane diisocyanate (pMDI) with an enhanced 2,4'-MDI isomer content (such as that commercially available by Bayer Corp. under the tradename MONDUR® MRS, or other equivalent) and polypropylene glycol and benzoyl chloride as a stabilizer.

Other suitable polyisocyanates used to prepare the prepolymer of the polyurethane composition include any compounds having at least two isocyanate moieties. Diisocyanates can be exemplified by 1,5-naphthylene diisocyanate, 4,4'-diphenylmethane diisocyanate (4,4'-MDI), 4,4'-diphenyldimethylmethane diisocyanate, 4,4'-dibenzyl diisocyanate, dialkyldiphenylmethane diisocyanate, 1,3-phenylene diisocyanate, 1,4-phenylene diisocyanate, toluene diisocyanate, butane-1,4-diisocyanate, hexamethylene diisocyanate, isopropylene diisocyanate, naphthylene diisocyanate, methylene diisocyanate, 2,2,4-trimethylhexamethylene diisocyanate, cyclohexane-1,4-diisocyanate, xylylene diisocyanate, hydrogenated xylylene diisocyanate, isophorone diisocyanate, lysine diisocyanate, dicyclohexylmethane-4,4'-diisocyanate, 1,3-bis(isocyanatomethyl)cyclohexane, methyl-cyclohexane diisocyanate, m-tetramethylxylylene diisocyanate, 2,4,6-triisopropylbenzene diisocyanate, isopropylidene bis(4-cyclohexylisocyanate), and mixtures thereof. Exemplary mixtures of diisocyanates include mixtures of 4,4'-MDI and 2,4-MDI.

The polyisocyanate used to prepare the prepolymer can also be a polyisocyanate prepared, for example, by reacting a diisocyanate with a diisocyanate-reactive compound such as a polyol e.g., a diol or polyamine, e.g., a diamine. Exemplary polyisocyanates used to prepare the prepolymer include polymeric forms of MDI. The polyisocyanate used to prepare the prepolymer can also be a carbodimide-modified diisocyanate, e.g., a carbodiimide-modified MDI. In certain embodiments, the polyisocyanate used to prepare the prepolymer can have an isocyanate (NCO) content that varies from 15% to 40% (mass percent) as measured by ASTM D2572, preferably from 10% to 20%.

When the multi-part polymeric resin system is a polyurethane system, for example, the polyisocyanate prepolymer is reacted with a polyol. In general, the polyol can be any polyol (i.e., a compound having more than one hydroxyl group appended thereto) that can react with an isocyanate group. Examples of polyols include glycols, i.e., diols containing a 1,2 dihydroxy group such as ethylene glycol or propylene glycol and derivatives thereof, and glycerol or glycerin and derivatives thereof. Examples of polyols include polypropylene glycol and polytetramethylene ether glycol. More specifically, the polyol is preferably chosen from a group of polyols having a molecular weight of less than about 600. In one example, the polyol is chosen from a group of polyols having a weight average molecular weight from about 300 to about 600 Daltons.

While polypropylene glycol (such as that commercially available from Lonza Corp. under the tradename POLY-G® 20-56) is a preferred polyol for use in synthesizing the polyurethane backbone, those of skill in the art will recognize that other polyols are suitable. Such other polyols include, for example, polybutadiene polyol. Examples of polybutadiene polyols include, but are not limited to, liquid hydroxyl terminated polymers of butadiene sold under the names POLY BD® R-45HTLO and POLY BD® R-20LM, both commercially available from Cray Valley USA, LLC, Exton, Pa., USA, as well as under the name HYPRO™ 2800X95 HTB, commercially available from CVC Thermoset Specialties, Moorestown, N.J., USA.

In some embodiments, the polyol is an asymmetric diol having from 3 to 20 carbon atoms, more preferably 4 to 12 carbon atoms, and most preferably 5 to 10 carbon atoms. Examples of such asymmetric diols include, but are not limited to: 2-ethyl-1,3-hexanediol; 1,2-propanediol; 1,3-butanediol; 2,2,4-trimethyl-1,3-pentanediol, 1,12-octadecanediol; 1,2-hexanediol; 1,2-octanediol; and 1,2-decanediol. Further examples of polyols include a tetrol such as pentaerythritol. The polyol can also be a polyether polyol prepared from either ethylene oxide and/or propylene oxide optionally reacted with another polyol such as glycol or glycerol.

In certain embodiments, the percentage of polymeric MDI and polypropylene glycol used to synthesize the polyurethane backbone can be from 40 to 60 wt. %, based on the total wt. % of the flood coat composition. In a particular embodiment, the percentage of polymeric MDI present is about 40 wt. % and the percentage of polypropylene glycol present is about 60 wt. %, based on the total wt. % of the flood coat composition.

In the same or other embodiments of the polymeric resin system, a polyol is present in an amount from 93 to 98 wt. %, based on the total wt. % of the portion containing the polyol, and having less than 0.03 wt. % water. In the same or other embodiments, castor oil is the preferred polyol suitable for use with the multi-part polyurethane resin systems according to the present invention. The castor oil, i.e., ricinoleic acid triglyceride, is a renewable raw material that is widely commercially available. The invention also contemplates that a derivative of castor oil includes any polyol derived from castor oil, which includes a hydrolysis product, an ethoxylated product, a transesterfied product, or an esterfied product, or a polyamide product. Other suitable polyols will be known to those of skill in the art, however, and it will be appreciated that the polyols may be the same or different. For example, in certain embodiments, it is contemplated that the polyol(s) suitable for use in one part (e.g., Part A) of the multi-part resin system are also suitable for use with a second part (e.g., Part B) of the multi-part resin system.

The urethane catalyst of the polyurethane flood coat composition can be any urethane catalyst commercially available and/or known to those skilled in the art. Examples of urethane catalysts include tin catalysts such as dialkyl tin dialkanoates, for example, FOMREZ® catalyst UL-28 (dimethyltin dineodecanoate), which provides very short gel and tack-free times as well as good solubility in polyurethane systems. Other examples of urethane catalysts include, but are not limited to: stannous octoate, commercially available as DABCO® T-9 from Air Products, Allentown, Pa., USA; organotin, commercially available as DABCO® 131 from Air Products, Allentown, Pa., USA; 1,4-diazabicyclooctane, available as DABCO® Crystalline Catalyst from Air Products, Allentown, Pa., USA; n-cetyl-n,n-dimethylamine, available as DABCO® B-16 from Air Products, Allentown, Pa., USA; dibutyltin dilaurate, available as DABCO® T-12 from Air Products, Allentown, Pa., USA; dibutyltin diacetate, available as METACURE™ T-1 catalyst from Air Products, Allentown, Pa., USA; a blend of zinc neodecanoate, bismuth neodecanoate and neodecanoic acid, available as BiCAT® 8 from Shepherd Chemical Company, Norwood, Ohio, USA; ferric acetylacetonate, available as AMSPEC® GCR-56 from Amspec Chemical Corporation, Bear, Del., USA; and oleic acid, available as Oleic Acid 105 from Acme-Hardesty Company, Blue Bell, Pa., USA.

In other embodiments, the multi-part polymeric resin system can be formed from epoxy resins, which are low molecular weight pre-polymers or higher molecular weight polymers which normally contain at least two epoxide groups. Those skilled in the art will appreciate that a wide range of epoxy resins having epoxide equivalent weights (EEW) ranging from 174 g/mol to 450 g/mol are produced industrially (e.g., bisphenol A diglycidyl ether, bisphenol F, Novolac epoxy resin, aliphatic epoxy resins such glycidyl and cycloaliphatic epoxides, and glycidylamine epoxy resin) and are suitable for use with the present invention. In certain embodiments, Part A of the polymeric resin system can include diglycidyl ethers of bisphenol-A (DGEBA) having epoxide equivalent weights (EEW) ranging from 174 g/mol to 250 g/mol, preferably from 185 g/mol to 195 g/mol.

In certain embodiments, the multi-part polymeric resin system can be a hybrid system that includes any epoxy resins and isocyanate prepolymer resins discussed above.

As those skilled in the art will appreciate, curing of the multi-part epoxy resin system according to the invention may be performed by homopolymerization or by forming a copolymer with a suitable polyfunctional curative or hardener. In principle, any molecule containing a reactive hydrogen may react with the epoxide groups of the epoxy resin system according to the invention. Common classes of hardeners for epoxy resins include amines, acids, acid anhydrides, phenols, alcohols and thiols. In certain embodiments, the primary curing agent includes an amine, such as an aromatic and/or aliphatic polyamine.

The aromatic diamine hardeners useful in curing the multi-part epoxy resin systems of this invention include any of the aromatic diamine hardeners conventionally used to cure epoxy resins. Examples of such hardeners include, without limitation, 4,4'-diaminodiphenyl ether; 3,3'-diaminodiphenyl sulfone; p-phenylenediamine; 4,4'-diaminodiphenyl propane; 4,4'-diaminodiphenyl-sulfide; 1,4-bis(p-aminophenoxy)benzene; 1,4-bis(m-aminophenoxy)benzene; 3,3'-diaminodiphenyl methane; m-phenylenediamine; 1,3-bis-(m-aminophenoxy)benzene; eutectic mixtures of m-phenylenediamine and 4,4'-diaminodiphenyl methane; 4,4'-diaminodiphenyl methane; 3,4'-diaminodiphenyl ether; bis(4-aminocyclohexyl)methane; 4,4'-(3-phenylenediisopropylidene)bisaniline; 4,4'(4-phenylenediisopropylidene)bisaniline; 4,4'-(3-phenylenediisopropylidene)bis-(3-toluidene); 4,4'-bis(3-aminophenoxy)-diphenyl sulfone; 2,2-bis[4-(4-aminophenoxy)phenyl]propane; trimethylene glycol di-p-aminobenzoate; 4,4'-diaminodiphenyl sulfone; 4,4'-bis(4-aminophenoxy)diphenyl sulfone; 4,4'-bis(4-aminophenoxy)-3,3',5,5'-tetramethyl diphenyl sulfone; 4,4'-bis(4-amino-3-methylphenoxy)diphenylsulfone; the ring alkylated derivatives of m-phenylenediamine; Bis(dimethylaminomethyl)phenol (ANCAMINE® K54); and Mercaptan-Terminated Epoxy Curing Agent (available as CAPCURE® 3-800 from Gabriel Performance Products, Ashtabula, Ohio).

Similarly, the aliphatic diamine hardeners useful in curing the multi-part epoxy resin systems of this invention include any of the aliphatic diamine hardeners conventionally used to cure epoxy resins. Examples of such aliphatic diamine hardeners include, but are not limited to, Diethylenetriamine (DETA); triethylenetetramine (TETA); teraethylenepentamine (TEPA); pentaethylenehexamine (PEHA); hexamethylenediamine (HMDA); N-(2-aminoethyl)-1,3-propanediamine ($N_3$-Amine); N,N'-1,2-ethanediylbis-1,3-propanediamine ($N_4$-amine), or dipropylenetriamine; an arylaliphatic polyamine such as m-xylylenediamine (mXDA), or p-xylylenediamine; a cycloaliphatic polyamine such as 1,3-bisaminocyclohexylamine (1,3-BAC), isophorone diamine (IPDA), or 4,4'-methylenebiscyclohexanamine (PACM), 4,4'-Methylenebis-(2-methyl-cyclohexanamine); an aromatic polyamine such as m-phenylenediamine, diaminodiphenylmethane (DDM), or diaminodiphenylsulfone (DDS); a heterocyclic polyamine such as N-aminoethylpiperazine (NAEP), or 3,9-bis(3- aminopropyl)2,4,8,10-tetraoxaspiro (5,5)undecane; a polyalkoxypolyamine where the alkoxy group can be an oxyethylene, oxypropylene, oxy-1,2-butylene, oxy-1,4-butylene or co-polymers thereof such as 4,7-dioxadecane-1,10-diamine, 1-propanamine,3,3'-(oxybis(2,1-ethanediyloxy))bis (diaminopropylated diethylene glycol ANCAMINE® 1922A), poly(oxy(methyl-1,2-ethanediyl)), alpha-(2-aminomethylethyl) omega-(2-aminomethylethoxy) (JEFFAMINE® D 230, D-400), triethyleneglycoldiamine and oligomers (JEFFAMINE® XTJ-504, JEFFAMINE® XTJ-512), poly(oxy(methyl-1,2-ethanediyl)), alpha,alpha'-(oxydi-2,1-ethanediyl)bis(omega-(aminomethylethoxy)) (JEFFAMINE® XTJ-511), bis(3-aminopropyl)polytetrahydrofuran 350, bis(3-aminopropyl)polytetrahydrofuran 750, poly(oxy (methyl-1,2-ethanediyl)), a-hydro-w-(2-aminomethylethoxy)ether with 2-ethyl-2-(hydroxymethyl)-1,3-propanediol (3:1) (JEFFAMINE® T-403), and diaminopropyl dipropylene glycol. JEFFAMINE® is a registered trademark of Huntsman Petrochemical LLC.

Particularly suitable polyamines include polyamines selected from diethylenetriamine (DETA), triethylenetetramine (TETA), 1,3-bisaminocyclohexylamine (1,3-BAC), isophoronediamine (IPDA), 4,4'-methylenebiscyclohexanamine (PACM), 3,3'Dimethyl PACM (ANCAMINE® 2049), N-aminoethylpiperazine (NAEP), 4,7-dioxadecane-1,10-diamine,1-propanamine,3,3'-(oxybis(2,1-ethanediyloxy-))bis-(ANCAMINE® 1922A), poly(oxy(methyl-1,2-ethanediyl)),alpha-(2-aminomethylethyl)omega-(2-aminomethylethoxy (JEFFAMINE® D 230, D-400), triethylene glycol diamine (JEFFAMINE® XTJ-504), and poly(oxy (methyl-1,2-ethanediyl))alpha,alpha'-(oxy(di-2,1-ethanediyl))bis(-omega-(aminomethylethoxy)). (JEFFAMINE® XTJ-511) or mixture thereof. ANCAMINE® is a registered trademark of Air Products and Chemicals, Inc.

In still other embodiments, the multi-part polymer resin system can include an epoxy/polyurethane hybrid system, wherein the epoxy and polyurethane resins are as described above.

The polymeric resin system can be further formulated with a rheology agent/modifier contained in one or more parts of the multi-part system. The rheology agent can include any synthetic and natural anti-sagging additives from BYK Additives/Elements Specialties, Wallingford, Conn., USA, along with primary amine-terminated polyether compounds. Primary amine-terminated polyether compounds include, but are not limited to polyoxypropylene amine having a weight average molecular weight from about 110 or 200 Da, to preferably about 500 Da (although molecular weights up to about 2000 Da are also suitable) and an amine functionality of about 2 to 3, preferably about 2. Such primary amino-terminated polyethers are manufactured and sold by Huntsman Corporation, Salt Lake City, Utah, under the name JEFFAMINE®. Particularly preferred is JEFFAMINE® D-230, which is a polyoxypropylene glycol terminated with primary amines and having an amine functionality of 2 and a molecular weight of about 230. Crosslinking in the adhesive composition can be further accelerated by adding a hydroxyl-containing tertiary amine such as diisoproponol amine commercially available as QUADROL® by BASF Corp., Germany. Thixotropy develops rapidly when the two or more parts of the resin system are mixed together in the presence of such amines. Rheology agents (or thixotropic agents) also include, but are not limited to, inorganic additives and can include, for example, fumed silica, amorphous silicon dioxide, clays, bentonites, talcs, and the like, and combinations thereof.

While fumed silica is preferred in certain embodiments, the same rheology can also be achieved by using reinforcing fibers. Suitable reinforcing fibers include organic or inorganic fibers, natural fibers or synthetic fibers, and may be present in various forms.

In certain embodiments, the rheology agent contains from 2 to 6 wt. % of fumed silica, based on the total wt. % of the portion containing the rheology agent (such as that commercially available from Cabot Corp. under the tradename CAB-O-SIL® M-5), and the catalyst contains from 0.2 wt. % to 0.5 wt. % (based on the total weight of the portion containing the catalyst), of an organo-metallic catalyst such as dibutyltin acetate (commercially available from Air Products under the tradename METACURE® T-1). While these are understood to be preferred embodiments, the specific rheology agent/modifier and/or catalyst are not critical as other suitable agents and catalysts can be used. Rather, what is important is to have the gel time and the reactivity be in close proximity in order to achieve the vertical build (i.e., on the elongated circuit components projecting outwardly from the base of the circuit board or other such electronic device) desired for environmental protection, while allowing adequate flow to achieve a horizontal build sufficient to provide the desired mechanical support upon cure of the flood coat composition.

Accordingly, in certain embodiments, the thixotropic index of the flood coat composition can be from 1 to 5, and preferably from 1.20 to 3.50, more preferably from 1.22 to 1.23, when the multi-part polymeric resin system is polyurethane. As used herein, the term "thixotropic index" refers to the viscosity measured at 2.5 RPM divided by the viscosity measured at 20 RPM of a mix ratio of a first part and a second part, where the appropriate weight amounts of the first part and second part are mixed for 1-2 minutes at 25° C., and the viscosity of the mixture is determined using a Brookfield viscometer with a #7 spindle at 2.5 RPM, and then at 20 RPM.

In the same or other embodiments, the gel time is from 5 to 15 minutes, and preferably from 5 to 12. In the same or other embodiments, the viscosity of the mix ratio of a first part (e.g., Part A) and second part (e.g., Part B) is from 15,000 to 18,000 cps, and preferably from 15,000 to 16,500 cps. It is contemplated that elements and features of one embodiment may be beneficially incorporated in other embodiments without further recitation. It is further contemplated that the individual parts of the multi-part polymeric resin system can be mixed in any ratio or amount.

The flood coat compositions contemplated herein may also contain, in one or more part, other suitable fillers or additives. The filler may be any suitable filler known in the art, including, but not limited to talc, calcium carbonate, barium sulfate, magnesium hydroxide, clay, mica, titanium dioxide, or any combination of the foregoing.

One or more parts of the flood coat composition may also include a defoamer. In one embodiment, a defoamer is added in an amount from about 0.01 wt. % to about 0.1 wt. % based on the total weight of the part containing the defoamer. In another embodiment, a defoamer is added in an amount from about 0.005 wt. % to about 0.05 wt. % based on the total weight of the part containing the defoamer. The defoamer utilized in one or more parts may be any defoamer that is known in the art. In one example, the defoamer is a silicone based defoamer, such as, for example, an alkyl aryl silicone polymer-based antifoaming additive, commercially available as SF8843 from Momentive Performance Materials Holdings LLC, Columbus, Ohio, USA. In another embodiment, the defoamer is a silicone free defoamer, such as an isoparaffin based defoamer, such as, for example, BYK 054, available from BYK USA, Inc., Wallingford, Conn., USA.

The flood coat composition may also include a plasticizer in one or more parts. Suitable plasticizers include, but are not limited to, azelates, sebacates, maleates, succinates, phthalates, adipates, dicarboxylic/tricarboxylic ester-based plasticizers, phosphates, trimellitates, glutarates, citrates, dipropylene glycol benzoates, diethylene glycol dibenzoates, epoxidized soybean oil, esters of soybean oil or combinations of any of the foregoing plasticizers.

Examples of phthalate-based plasticizers include, but are not limited to: bis(2-ethylhexyl) phthalate, diisononyl phthalate, di-n-butyl phthalate, butyl benzyl phthalate, diisodecyl phthalate, do-n-octyl phthalate, diisooctyl phthalate, diethyl phthalate, diisobutyl phthalate, dioctyl phthalate, diundecyl phthalate, and di-n-hexyl phthalate.

Examples of trimellitates include, but are not limited to: trimethyl trimellitate, tri-(2-ethylhexyl)trimellitate, tri-(n-octyl, n-decyl)trimellitate, tri-(heptyl, nonyl)trimellitate, n-octyl trimellitate.

Examples of adipates, glutarates, dicarboxylic acids, phosphates, sebacates, and maleates include, but are not limited to: 1,2-benzene dicarboxylic acid, polyester glutarate, oisopropylphenyl diphenyl phosphate, tri-n-butyl citrate, dialky diether glutarate, bis(2-ethylhexyl)adipate, dioctyl adipate, polyester adipate, dimethyl adipate, monomethyl adipate, diisodecyl adipate, diisononyl adipate, bis(2-ethylhexyl)sebacate, bis(2-ethylhexyl)azelainate, tri(2-ethylhexyl)trimellitate, di(C7-9-alkyl) adipate, butyl fumarate, diisobutyl fumarate, bis(2-ethylhexyl)fumarate, diethyl maleate, dimethyl maleate, diheptyl adipate, dioctyl adipate, dinonyl adipate, dibutyl debacate, dibutyl maleate, diisobutyl maleate.

Examples of esters of soybean oil include methyl soyate, ethyl soyate and propyl soyate. Examples of benzoates include, but are not limited to: 1-[2-(benzoyloxy)propoxy] propan-2-yl benzoate, commercially available as Benzoflex™ from Eastman Chemical Company, Kingsport, Tenn., USA.

Other examples of plasticizers include, but are not limited to: dioctyl terephthalate, 1,2-cyclohexane dicarboxylic acid diisononyl ester, epoxidized vegetable oils, alkyl sulphonic acid phenyl ester, N-ethyl toluene sulfonamide (ortho and para isomers), N-(2-hydroxypropyl)benzene sulfonamide, N-(n-butyl)benzene sulfonamide, tricresyl phosphate, tributyl phosphate, glycols/polyethers, organophosphates, triethylene glycol dihexanoate, tetraethylene glycol diheptanoate, polymeric plasticizers, polybutene, acetylated monoglycerides, alkyl citrates, triethyl citrate, acetyl triethyl citrate, tributyl citrate, acetyl tributyl citrate, trioctyl citrate, acetyl trioctyl citrate, trihexyl citrate, acetyl trihexyl citrate, butyryl trihexyl sitrate and trimethyl citrate.

Suitable commercially available plasticizers also include diisodecyl phthalate, sold as JAYFLEX™ from Exxon Mobil Chemical, Houston, Tex., USA. Other acceptable phthalate plasticizers include other JAYFLEX™ plasticizers from Exxon Mobil Chemical, Houston, Tex., USA, (such as, for example, JAYFLEX DOP), the DIOCTYL™, SANTICIZER®, and DIBUTYL™ plasticizers commercially available from Monsanto, St. Louis, Mo., USA, and the ADIMOLL®, DISFLAMOLL®, MESAMOLL®, UNIMOLL®, TEGDA™, TRIACETIN™ and ULTRAMOLL™ plasticizers commercially available from Bayer Corporation, Germany. Preferred plasticizers have low volatility, such as long chain, branched phthalates (e.g., ditridecyl phthalate, di-L-nonyl phthalate and di-L-undecyl phthalate). Useful dibenzoates are available as BENZOFLEX® 988, BENZOFLEX® 50 and BENZOFLEX® 400 commercially available from Velsicol Chemical Corporation, Rosemont, Ill., USA. Soybean oil is commercially available under the trade name FLEXOL™ EPO, from Dow Chemicals, DE, USA.

As those skilled in the art will appreciate the multi-part polymer resin systems as described herein can be combined or mixed in any manner acceptable to form such polymeric resin systems. Such methods include, but are not limited to, hand mixing, static mixing, or dynamic mixing. It is further noted that the individual parts of the multi-part system can be added in any order (e.g., Part A can be mixed with Part B, or vice versa). It is noted that the term "initial mix viscosity" refers to the viscosity of the flood coat composition when the individual parts of the multi-part polymer resin system are first combined or mixed together. Typically the initial mix viscosity of the flood coat composition is from 5,000 cps to 40,000 cps, or any value in between. In preferred embodiments, the initial mix viscosity is from 8,000 cps to 12,000 cps.

Figure 1:
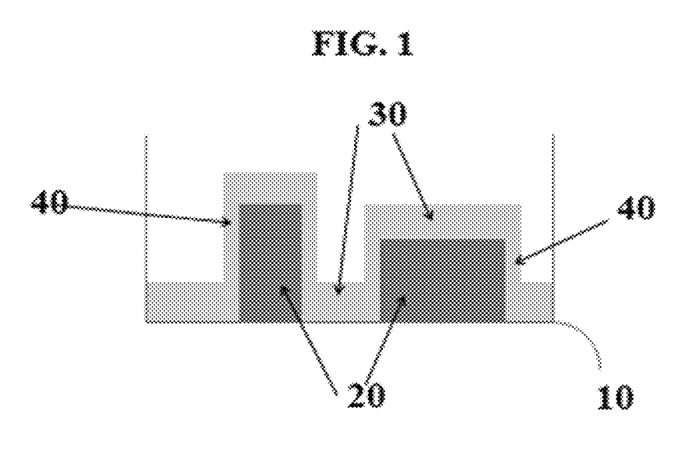
FIG. 1 illustrates a cross-section perspective view of an electronic circuit board assembly having tall electric circuit components extending outwardly from the surface of a base support with a flood coat composition as described herein applied thereto.

In another aspect, and with reference to FIG. 1, the invention provides electrical circuit assemblies including a base support 10 with a plurality of electrical circuit components 20 extending outwardly from the surface of the base support 10 attached thereto and electrically connected to the electrical circuitry (not shown), which is flood coated with a predetermined volume of a flood coat composition as defined and described in detail herein to substantially cover and/or encapsulate the electrical circuit assembly upon cure, wherein the flood coat composition has a sufficient gel time and thixotropic index such that the thickness of the flood coat composition on component surfaces parallel (i.e., horizontal) 30 to the base support 10 is from 10 mils to 75 mils, and the thickness of the flood coat composition on component surfaces perpendicular (i.e., vertical) 40 to the base support 10 is from 4 mils to 20 mils. As those skilled in the art will appreciate, the units "mils" as used herein (also known as "thous") refers to an imperial length unit and is equal to 1/1000 of an inch. As used herein, the term "substantially covers and/or encapsulates" means that a majority of the electrical circuit assembly and/or electrical circuit components is covered by the flood coat composition, e.g., greater than 80%; more preferably greater than 90%; or more preferably still 100%.

In certain embodiments the thickness of the flood coat composition on component surfaces perpendicular to the base support is greater than 4 mils and less than 20 mils, and preferably less than 10 mils. In the same or other embodiments, the thickness of the flood coat composition on component surfaces horizontal to the base support is greater than 20 mils and less than 75 mils, preferably greater than 40 mils and less than 60 mils. It is contemplated that elements and features of one embodiment may be beneficially incorporated in other embodiments without further recitation.

Again, obtaining these key characteristics is done by controlling the reactivity and the rheology to allow the resin system to be applied manually or through automation (i.e., a flood coat process, wherein the resin can be dispensed in the form of a ribbon or curtain), which allows it to cover all components flowing down vertical surfaces while maintaining a 4 mils to 20 mils build on all vertical surfaces.

While flowing down the vertical surfaces, the resin will build at a thickness from 125 mils to 500 mils on the horizontal surfaces, thereby providing mechanical support of large components. In preferred embodiments, the horizontal build is greater than 20 mils and less than 75 mils, preferably greater than 40 mils and less than 60 mils.

Figure 2A:
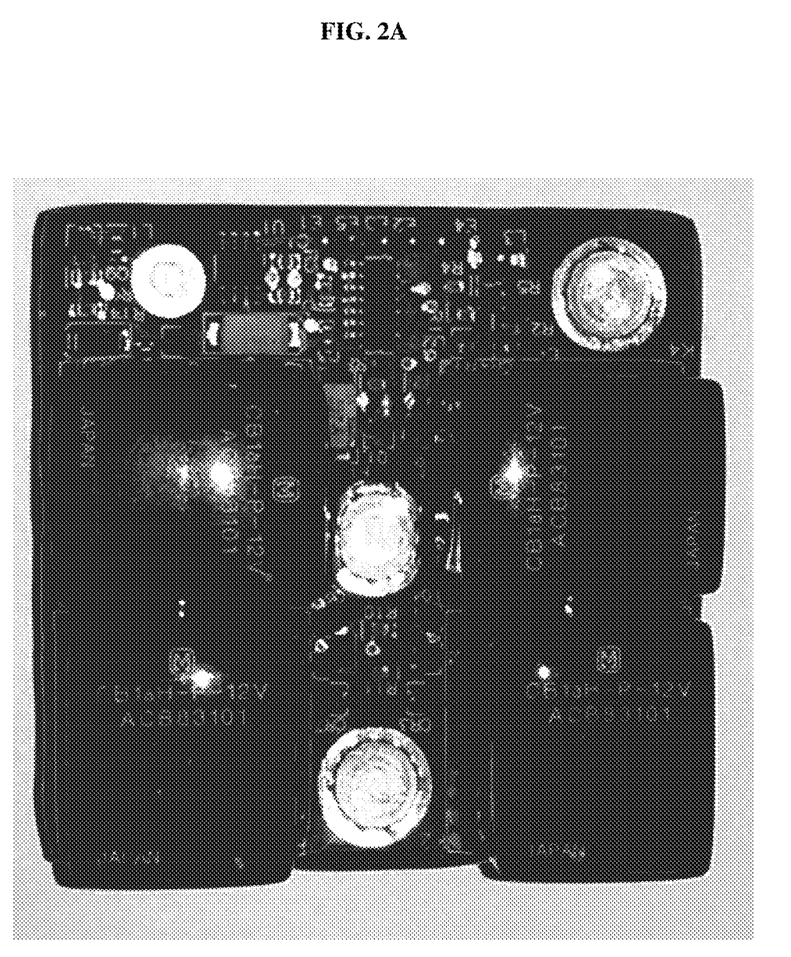
FIGS. 2A-2B together depict a top and side view, respectively, of an actual electronic circuit assembly flood coated with a composition as described herein thereby effectively encapsulating and protecting the assembly and the electronic circuitry.
Figure 2B:
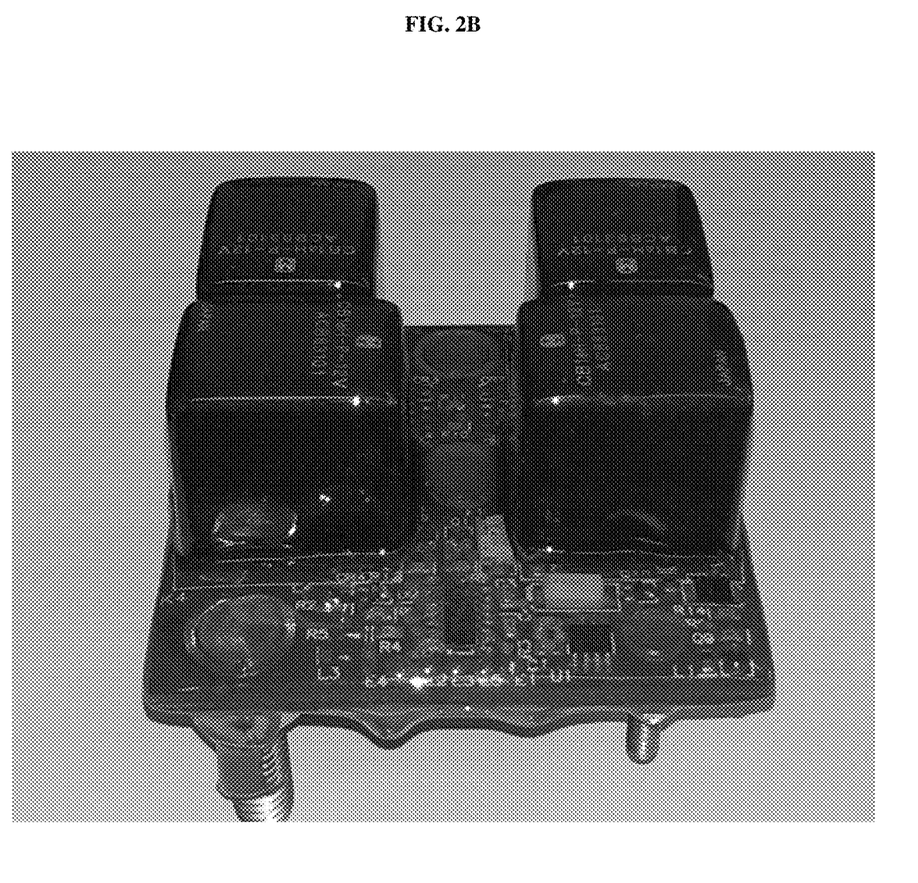

While the formulated flood coat resin system described herein is suitable for use with any electrical circuit assembly, exemplary devices include, but are not limited to, electrical circuit boards used in PCs, inverters (e.g., micro solar inverters), converters, power supplies, and the like. Reference is given to FIGS. 2A-2B.

In still another aspect, the present invention provides methods of encapsulating or flood coating an electrical circuit assembly by pressurizing a flood coat resin system composition as defined and described herein in detail at a predetermined pressure with an inert gas, applying a predetermined volume of the flood coat composition completely over said assembly at said predetermined pressure, allowing the flood coat composition to gel, and curing the coated assembly for a time and at a temperature sufficient to provide a Shore hardness of 15 A to 85 D, measured in accordance with ASTM D2240-05.

In certain embodiments the pressure applied is 30 psi and the inert gas is dry nitrogen. In same or other embodiments, the curing step is from 5 to 7 days at a temperature of 25° C.

Other embodiments of the invention include the following:

Embodiment 1

A flood coat composition comprising a multi-part polymeric resin system characterized by having a gel time from 5 to 12 minutes, and a thixotropic index from 1 to 5 such that when cured, the flood coat composition includes a Shore hardness from 15 A to 85 D.

Embodiment 2

A flood coat composition according to embodiment 1, wherein the polymeric resin system includes polyurethane.

Embodiment 3

A flood coat composition according to embodiment 2 further characterized by having a thixotropic index from 1 to 1.5 and a Shore hardness from 30 A to 60 A.

Embodiment 4

A flood coat composition according to embodiment 2 or embodiment 3, wherein the polyurethane resin system includes castor oil.

Embodiment 5

A flood coat composition according to embodiment 1, wherein the polymeric resin system includes epoxy functional groups.

Embodiment 6

A flood coat composition according to embodiment 5, wherein the polymeric resin system further includes polyurethane.

Embodiment 7

A flood coat composition according to embodiment 5 or embodiment 6 further characterized by having a thixotropic index from 3 to 5 and a Shore hardness from 40 A to 85 D.

Embodiment 8

A flood coat composition according to any one of the preceding embodiments (1 to 7), wherein the polymeric resin system further includes one or more defoamer, plasticizer, or rheology agent.

Embodiment 9

An electrical circuit assembly comprising a base support with a plurality of electrical circuit components extending outwardly from the surface of the base support attached thereto and electrically connected to the electrical circuitry, wherein the electrical circuit assembly is flood coated with a predetermined volume of a flood coat composition according to any one of embodiments 1 to 8 such that the flood coat composition substantially covers or encapsulates the electrical circuit assembly as a fixed mass upon cure and has a thickness on component surfaces horizontal to the base support from 20 mils to 75 mils and a thickness on component surfaces perpendicular to the base support from 4 mils to 20 mils.

Embodiment 10

An electrical circuit assembly according to embodiment 9, wherein the thickness of the flood coat composition on component surfaces horizontal to the base support is greater than 20 mils and less than 70 mils.

Embodiment 11

An electrical circuit assembly according to embodiment 9 or embodiment 10, wherein the thickness of the flood coat composition on component surfaces perpendicular to the base support is greater than 4 mils and less than 20 mils.

Embodiment 12

An electrical circuit assembly according to any one of embodiments 9 to 11, wherein said assembly is housed within en electronic device.

Embodiment 13

An electrical circuit assembly according to any one of embodiments 9 to 12 further characterized by having improved mechanical support and environmental protection when exposed to temperature extremes and/or vibration.

Embodiment 14

An electrical circuit assembly comprising a base support with a plurality of electrical circuit components extending outwardly from the surface of the base support attached thereto and electrically connected to the electrical circuitry, wherein the electrical circuit assembly is flood coated with a predetermined volume of a flood coat composition to substantially cover or encapsulate the electrical circuit assembly as a fixed mass upon cure, said flood coat composition having a sufficient gel time and thixotropic index such that the thickness of the flood coat composition on component surfaces horizontal to the base support is from 20 mils to 75 mils, and the thickness of the flood coat composition on component surfaces perpendicular to the base support is from 4 mils to 20 mils upon cure.

Embodiment 15

An electrical circuit assembly according to embodiment 14, wherein the flood coat composition comprises a polymeric resin selected from the group consisting of polyurethane, silicone, epoxy, and acrylic.

Embodiment 16

An electrical circuit assembly according to embodiment 14 or embodiment 15, wherein the thickness of the flood coat composition on component surfaces horizontal to the base support is greater than 20 mils and less than 70 mils.

Embodiment 17

An electrical circuit assembly according to any one of embodiments 14 to 16, wherein the thickness of the flood coat composition on component surfaces perpendicular to the base support is greater than 4 mils and less than 20 mils.

Embodiment 18

An electrical circuit assembly according to any one of embodiments 14 to 17, wherein the flood coat composition has a Shore hardness from 15 A to 85 D upon cure.

Embodiment 19

An electrical circuit assembly according to any one of embodiments 14 to 18, wherein the flood coat composition has a gel time from 5 minutes to 12 minutes.

Embodiment 20

An electrical circuit assembly according to any one of embodiments 15 to 19, wherein the polymeric resin comprises a multi-part polyurethane resin system and the thixotropic index is from 1 to 1.5.

Embodiment 21

An electrical circuit assembly according to embodiment 20, wherein the polyurethane resin system comprises castor oil.

Embodiment 22

An electrical circuit assembly according to any one of embodiments 15 to 19, wherein the polymeric resin comprises silicone and the thixotropic index is from 1 to 5.

Embodiment 23

An electrical circuit assembly according to any one of embodiments 18 to 22, wherein the Shore hardness is from 30 A to 90 A.

Embodiment 24

An electrical circuit assembly according to any one of embodiments 15 to 19, wherein the polymeric resin system includes epoxy functional groups and the thixotropic index is from 3 to 5.

Embodiment 25

An electrical circuit assembly according to embodiment 24, wherein the Shore hardness is from 40 A to 85 D.

Embodiment 26

An electrical circuit assembly according to any one of embodiments 9 to 25, wherein the flood coat composition has a weight from 60 grams to 150 grams.

Embodiment 27

An electrical circuit assembly according to embodiment 26, wherein the weight is greater than 60 grams and less than 100 grams.

Embodiment 28

An electrical circuit assembly according to any one of embodiments 14 to 27 further characterized by having improved mechanical support and environmental protection when exposed to temperature extremes and/or vibration.

EXAMPLES

The following examples are provided to assist one skilled in the art to further understand certain embodiments of the present invention. These examples are intended for illustration purposes and are not to be construed as limiting the scope of the various embodiments of the present invention.

Example 1—Preparation of Polymeric Resin Systems

A multi-part polyurethane resin system according to the invention is prepared as follows: In a first part (e.g., Part A), 41.10 parts by weight of the total weight of Part A of a medium functionality polymeric diphenylmethane diisocyanate (pMDI) having an enhanced 2,4'-MDI isomer content and isocyanate group (N—C—O) of 31 to 32 wt. % (such as MONDUR® MRS available from Bayer Corp. or equivalent) is reacted with 58.87 parts by weight of the total weight of Part A of polypropylene glycol (such as PolyG-20-56 available from Lonza Corporation, or equivalent), and 0.03 parts by weight of the total weight of Part A of benzoyl chloride as a stabilizer to form an MDI prepolymer having an N—C—O range between 10 to 12 wt. %. The reaction is performed at a temperature of 80-85° C. under a vacuum of >27" Hg for 4 hours.

In a second part (e.g., Part B), 93.57 parts by weight of the total weight of Part B of castor oil is dried by heating it at a temperature from 100-110° C. under a vacuum of >27" Hg for 1-2 hours in order to obtain a water content of <0.03 wt. %. A thixotropic agent such as fumed silica (available as CAB-O-SIL® M-5 from Cabot Corporation) at 6 parts by weight of the total weight of Part B is dried in an oven at 130° C. for 24 hours. The thixotropic agent is then mixed with the dry castor oil under a high speed (3000 rpm) shear for 45 minutes in order to achieve a desired rheology. 0.41 parts by weight of the total weight of Part B of a metallic catalyst such as tin-based dibutyltin diacetate (available as METACURE® T-1 from Air Products) is added to control the gel time when Parts A and B are mixed.

Other multi-part polymeric resin systems according to the invention are generally prepared in the same manner as above, though the components of the formulation and their amounts may differ.

Example 2—Flood Coating an Electronic Assembly

A 400 ml cartridge of a square style, 30 element static mixer, fitted with a 1" spade/flat tip, is filled with a polymeric resin system such as that prepared according to Example 1. Dry nitrogen at 30 psi is applied to the resin. A solar micro inverter weighing 1,853.00 grams is provided and the polymeric resin is applied through a dispensing gun that is held at an approximately 45° angle to the surface of the board. The resin "flood coats" the electrical circuit board and components as it is dispensed in the form of a ribbon or curtain and allowed to cover all components flowing down vertical surfaces, while maintaining a 4 mils-to 20 mils build (i.e., thickness) on all vertical surfaces (with 8 mils to 15 mils being preferred) due to rheology and reactivity control. While flowing down the vertical surfaces, the resin builds at a thickness of 125 mils to 500 mils on horizontal surfaces (with 20 mils to 75 mils being preferred, and 45 mils to 55 mils being most preferred), thereby resulting in mechanical support of large components. The coating or fill time from start to finish is about 5 minutes. The gel time is approximately 10-15 minutes, and the full cure time is about 7 days at 25° C. The weight of the solar micro inverter after flood coating is 2, 200.00 grams (i.e., 347.96 grams of polymeric resin material used).

Thus, using the polymeric flood coat resin composition and process described herein, the same environmental protection and mechanical support as that provided by conventional potting resin is achieved, while reducing the overall weight and resin cost used in a conventionally potted device by more than 50%.

Example 3—Environmental Tests on Enclosure Mounted and Flood Coated Circuit Boards Polymeric resins are prepared similarly as in Example 1 and used to flood coat electronic assemblies similarly as in Example 2. The flood coated assemblies are provided to Elite Electronic Engineering (Downers Grove, Ill.) for Highly Accelerated Life Testing (HALT) performed in accordance with GMW 8287, which is incorporated herein by reference. Various environmental tests are performed on the assemblies (hereinafter referred to as Device Under Test (DUT)). Specific DUTs and their corresponding formulations and characteristics (e.g., Shore hardness, thixotropic index, resin weight, and horizontal and vertical builds are provided below:

| DUT 1 - Conformal Coat | |
|---|---|
| Single Component | Comparative wt. % |
| TDI Isomers | 28.10 |
| Propylene Oxide #11,020-5 | 0.020 |
| Benzo Pyranone | 0.20 |
| 2-Methoxy-1-propyl acetate | 24.71 |
| Xylene | 12.00 |
| Toluene | 13.00 |
| Dipropylene Glycol | 4.00 |
| Polyol Blend | 17.97 |
| Shore Hardness | 70D |
| Thixotropic Index | N/A |
| Average Coating Weight (grams) | 2.0 |

| DUT 2 - PolyUrethane Flood Coat | |
|---|---|
| | Invention wt. % |
| Part A | |
| Diisocyanate | 99.88 |
| Polyether Diol | 0.02 |
| Benzoyl Chloride | 0.10 |
| Part A prepolymer NCO | 10-12% |
| Part A prepolymer viscosity (cps) | 15,000-18,000 |
| Part B | |
| Castor Oil Polyol | 93.53 |
| Alkyl aryl siloxane (defoamer) | 0.02 |
| Dibutyl-Tin Acetate | 0.35 |
| Fumed Silica | 6.10 |
| Part B mixture viscosity (cps) | 1,092 |
| Mix Ratio by Weight | 100A/126B |
| Part A + B mixture initial viscosity (cps) | 8,550 |
| Shore Hardness | 35A |
| Thixotropic Index | 1.22 |
| Average Coating Weight (grams) | 93.1 |
| Horizontal Thickness (mils = 1/1000 inch) | 60-64 |
| Vertical Thickness (mils = 1/1000 inch) | 4-6 |

| DUT 3 - Epoxy Flood Coat | |
|---|---|
| | Invention wt. % |
| Part A | |
| Diglycidyl ether of bisphenol A | 93.60 |
| Glycerin | 0.05 |
| Fumed Silica | 2.90 |
| Dioctyl Adipate | 3.00 |
| Part A prepolymer viscosity (cps) | 15,000-18,000 |
| Part B | |
| Mercaptan-terminated Epoxy | 86.30 |
| Bis(dimethylaminomethyl)phenol | 6.27 |
| Glycerin | 0.58 |
| Fumed Silica | 3.85 |
| Dioctyl Adipate | 3.00 |
| Part B mixture viscosity (cps) | 1,092 |
| Mix Ratio by Weight | 100A/18.5B |
| Part A + B mixture initial viscosity (cps) | 8,550 |
| Shore Hardness | 80D |
| Thixotropic Index | 4.5 |
| Average Coating Weight (grams) | 84.05 |
| Horizontal Thickness (mils = 1/1000 inch) | 47-50 |
| Vertical Thickness (mils = 1/1000 inch) | 9-12 |

| DUT 4 - Epoxy/PolyUrethane Hybrid Flood Coat | |
|---|---|
| | Invention wt. % |
| Part A | |
| Diglycidyl ether of bisphenol A | 60.480 |
| Alkyl Phenol Blocked Polyisocyanate | 25.872 |
| o-cresyl glycidyl ether | 9.60 |
| Acrylic based flow and leveling agent | 0.048 |
| Fumed Silica | 4.00 |
| Part A prepolymer viscosity (cps) | 15,000-18,000 |
| Part B | |
| Amine (curing agent) | 75.00 |
| Diglycidyl ether of bisphenol A | 25.00 |
| Part B mixture viscosity (cps) | 1,092 |
| Mix Ratio by Weight | 100A/18.5B |
| Part A + B mixture initial viscosity (cps) | 8,550 |
| Shore Hardness | 75D |
| Thixotropic Index | 4.0 |
| Average Coating Weight (grams) | 87.0 |
| Horizontal Thickness (mils = 1/1000 inch) | 47-50 |
| Vertical Thickness (mils = 1/1000 inch) | 9-12 |

| DUT 5 - Silicone Flood Coat | |
|---|---|
| Single Component | Invention wt. % |
| SYLGARD 170 Fast Cure Silicone Elastomer | 100 |
| Shore Hardness | 85A |
| Thixotropic Index | N/A |
| Average Coating Weight (grams) | 82.4 |
| Horizontal Thickness (mils = 1/1000 inch) | 50-53 |
| Vertical Thickness (mils = 1/1000 inch) | 15-18 |

| DUT 6 - Control | |
|---|---|
| | Comparative wt. % |
| No Polymeric Resin | 0.00 |
| Shore Hardness | N/A |
| Thixotropic Index | N/A |
| Average Coating Weight (grams) | N/A |
| Horizontal Thickness (mils = 1/1000 inch) | N/A |
| Vertical Thickness (mils = 1/1000 inch) | N/A |

The DUTs are connected to monitoring equipment, which power the DUTs with 12 VDC throughout the various environmental tests. The DUTs are connected to an event detector which is used to monitor the DUTs for proper operation throughout the various tests. The DUTs are also visually monitored for signs of physical damage or degradation. Acceptance criteria is established to determine the overall reliability of the DUTs when subjected to various environmental stresses.

A. Rapid Thermal Transition Test

Prior to testing the DUTs, a thermocouple (Model No. 445715, manufactured by Extech) is attached to one of the DUTs to determine and control the temperature of the DUTs during testing. The DUTs are then mounted rigidly to a moveable table of the HALT chamber (Model No. AST-35, manufactured by Thermotron; frequency range −100° C. to 200° C.), and connected to an event detector. The DUTs are subjected to rapid thermal transition testing with reference to GMW 8287.

Starting at +20° C., the HALT chamber temperature is decreased to −40° C. at a rate of 50° C. per minute and the DUTs are dwelled at this temperature for 10 minutes following stabilization. The chamber is then increased to +120° C. at a rate of 50° C. per minute and the DUTs are dwelled at this temperature for 10 minutes following stabilization. The process is repeated twice for a total of three complete cycles.

B. Combined Environment Test

The DUTs are subjected to combined environment testing with reference to GMW 8287. Prior to testing the DUTs, a thermocouple (Model No. 445715, manufactured by Extech) is attached to one of the DUTs to determine and control the temperature of the DUTs during testing. The DUTs are then mounted rigidly to a moveable table of the HALT chamber (Model No. AST-35, manufactured by Thermotron; frequency range −100° C. to 200° C.), and connected to an event detector.

With the HALT chamber cycling between −40° C. and +120° C., each temperature is maintained for a period of 20 minutes. Vibration was applied beginning at 8 Grms during the temperature cycles, and is increased by 8 Grms at the beginning of each thermal cycle. The combined environment test is continued until the maximum vibration level of 40 Grms is reached (i.e., 5 cycles).

Results of the rapid thermal transition test and the combined environment tests are reproduced in the table below:

TABLE 1

| Device Under Test (DUT) | Combined test 1 | Combined test 2 | Rapid thermal |
|---|---|---|---|
| DUT 1 (C) | F | P | P |
| DUT 2 | P | P | P |
| DUT 3 | P | P | P |
| DUT 4 | No device | P | P/Cracks |
| DUT 5 | No device | P | P |
| DUT 6 CONTROL | No device | F | P |

C = Comparative
P = Pass (No abnormal operation of DUT)
F = Fail (Event detector recorded failure of DUT)

The results show that DUTs flood coated with various polymers are reliable devices under conditions with combined environments (i.e., thermal and vibrational stress) or exposed to rapid thermal transitions as compared to devices having conformal coatings and devices with no coatings.

Various patent and/or scientific literature references have been referred to throughout this application. The disclosures of these publications in their entireties are hereby incorporated by reference as if written herein. In the case of conflicting terms, the terms of this document will take preference. In view of the above description and the examples, one of ordinary skill in the art will be able to practice the invention as claimed without undue experimentation.

Although the foregoing description has shown, described, and pointed out the fundamental novel features of the present teachings, it will be understood that various omissions, substitutions, and changes to the invention as herein described may be made by those skilled in the art, without departing from the scope of the present teachings. Consequently, the scope of the present teachings should not be limited to the foregoing discussion, but should be defined by the appended claims.

What is claimed is:

1. A flood coat composition comprising a multi-part polymeric resin system comprising an epoxy-polyurethane hybrid resin, wherein said flood coat composition is characterized by having a gel time from 5 to 15 minutes, and a thixotropic index from 3 to 5, such that when cured, the flood coat composition provides a Shore hardness from 40A to 85D.

2. A flood coat composition according to claim 1, wherein the polyurethane resin system includes castor oil.

3. A flood coat composition according to claim 1, wherein the polymeric resin system further includes one or more defoamer, plasticizer, or rheology agent.

4. An electrical circuit assembly comprising a base support with a plurality of electrical circuit components extending outwardly from the surface of the base support attached thereto and electrically connected to the electrical circuitry, wherein the electrical circuit assembly is flood coated with a predetermined volume of a flood coat composition as defined in claim 1 such that the flood coat composition substantially covers or encapsulates the electrical circuit assembly as a fixed mass upon cure and has a thickness on component surfaces horizontal to the base support from 20 mils to 75 mils and a thickness on component surfaces perpendicular to the base support from 4 mils to 20 mils.

5. An electrical circuit assembly according to claim 4, wherein the thickness of the flood coat composition on component surfaces horizontal to the base support is greater than 20 mils and less than 70 mils.

6. An electrical circuit assembly according to claim 4, wherein the thickness of the flood coat composition on component surfaces perpendicular to the base support is greater than 4 mils and less than 20 mils.

7. An electrical circuit assembly according to claim 4, wherein said assembly is housed within an electronic device.

8. An electrical circuit assembly according to claim 4, further characterized by having improved mechanical support and environmental protection when exposed to temperature extremes and/or vibration.

9. An electrical circuit assembly comprising a base support with a plurality of electrical circuit components extending outwardly from the surface of the base support attached thereto and electrically connected to the electrical circuitry, wherein the electrical circuit assembly is flood coated with a predetermined volume of a flood coat composition comprising a multi-part polymeric resin system selected from the group consisting of epoxy, epoxy-polyurethane hybrid, silicone, acrylic, or mixtures thereof to substantially cover or encapsulate the electrical circuit assembly as a fixed mass upon cure, said flood coat composition having a sufficient gel time and thixotropic index such that the thickness of the flood coat composition on component surfaces horizontal to the base support is from 20 mils to 75 mils, and the thickness of the flood coat composition on component surfaces perpendicular to the base support is from 4 mils to 20 mils upon cure.

10. An electrical circuit assembly according to claim 9, wherein the thickness of the flood coat composition on component surfaces horizontal to the base support is greater than 20 mils and less than 70 mils.

11. An electrical circuit assembly according to claim 9, wherein the thickness of the flood coat composition on component surfaces perpendicular to the base support is greater than 4 mils and less than 20 mils.

12. An electrical circuit assembly according to claim 9, wherein the flood coat composition has a Shore hardness from 15A to 85D upon cure.

13. An electrical circuit assembly according to claim 9, wherein the flood coat composition has a gel time from 5 minutes to 15 minutes.

14. An electrical circuit assembly according to claim 9, wherein the thixotropic index is from 1 to 1.5.

15. An electrical circuit assembly according to claim 9, wherein the multi-part polymeric resin system comprises the epoxy-polyurethane hybrid, and the epoxy-polyurethane hybrid comprises castor oil.

16. An electrical circuit assembly according to claim 9, wherein the polymeric resin comprises silicone and the thixotropic index is from 1 to 5.

17. An electrical circuit assembly according to claim 12, wherein the Shore hardness is from 30A to 90A.

18. An electrical circuit assembly according to claim 9, wherein the polymeric resin system includes epoxy functional groups and the thixotropic index is from 3 to 5.

19. An electrical circuit assembly according to claim 18, wherein the Shore hardness is from 40A to 85D.

20. An electrical circuit assembly according to claim 5, wherein the flood coat composition has a weight from 60 grams to 150 grams.

21. An electrical circuit assembly according to claim 20, wherein the weight is greater than 60 grams and less than 100 grams.

22. An electrical circuit assembly according to claim 9, further characterized by having improved mechanical support and environmental protection when exposed to temperature extremes and/or vibration.

23. A flood coat composition according to claim 1, further characterized by having an initial mix viscosity of 5,000 to 40,000 cP.

24. A flood coat composition according to claim 23, further characterized by having an initial mix viscosity of 8,000 to 12,000 cP.

* * * * *